(12) United States Patent
Choi et al.

(10) Patent No.: US 10,186,961 B2
(45) Date of Patent: Jan. 22, 2019

(54) SYSTEM AND METHOD FOR OUTPUT VOLTAGE OVERSHOOT SUPPRESSION

(71) Applicant: Maxim Integrated Products, Inc., San Jose, CA (US)

(72) Inventors: Jinho Choi, Saratoga, CA (US); ChiYoung Kim, Cupertino, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 15/711,191

(22) Filed: Sep. 21, 2017

(65) Prior Publication Data

US 2018/0088614 A1  Mar. 29, 2018

Related U.S. Application Data

(60) Provisional application No. 62/399,649, filed on Sep. 26, 2016.

(51) Int. Cl.

| H02M 3/156 | (2006.01) |
| H02M 3/158 | (2006.01) |
| H02P 9/30 | (2006.01) |
| H03K 17/16 | (2006.01) |
| G05F 1/46 | (2006.01) |
| G05F 1/571 | (2006.01) |
| G05F 1/575 | (2006.01) |

(52) U.S. Cl.
CPC ......... *H02M 3/156* (2013.01); *H02M 3/1584* (2013.01); *H02P 9/307* (2013.01); *H03K 17/162* (2013.01); *H03K 17/165* (2013.01); *G05F 1/461* (2013.01); *G05F 1/571* (2013.01); *G05F 1/575* (2013.01); *H02M 2003/1566* (2013.01)

(58) Field of Classification Search
CPC .. H02M 3/158; H02M 3/1582; H02M 3/1584; H02M 2003/1586; H02M 3/156; H02M 3/155; H02M 3/157; H02M 3/1563; H02M 3/1588
USPC .................. 323/222, 271, 272, 282–285
See application file for complete search history.

(56) References Cited

U.S. PATENT DOCUMENTS

| 6,154,375 A | 11/2000 | Majid et al. |
| 6,614,208 B2 | 9/2003 | Narita |
| 7,719,251 B2 | 5/2010 | Qahouq et al. |
| 8,558,523 B2 | 10/2013 | Qiu et al. |

(Continued)

*Primary Examiner* — Nguyen Tran
(74) *Attorney, Agent, or Firm* — Kevin B. West; Advent, LLP

(57) ABSTRACT

A method for suppressing voltage overshoot at an output of a voltage regulator is disclosed. The voltage regulator includes at least one channel having a first set of (high-side) transistors and a second set of (low-side) transistors. In implementations of the method, an output voltage at an output of at least one channel of a voltage regulator is detected and compared with a reference voltage. A rate of change associated with the output voltage is also determined and compared with a threshold rate of change. When the output voltage is greater than the reference voltage and the rate of change is greater than the threshold rate of change, a resistance value associated with the second set of transistors is increased from a first resistance value to a second resistance value to prevent the output voltage from overshooting and/or to suppress an output voltage overshoot.

22 Claims, 12 Drawing Sheets

(56) References Cited

U.S. PATENT DOCUMENTS

| | | | | |
|---|---|---|---|---|
| 2006/0280715 A1* | 12/2006 | Vishnupad | ............ | A61K 9/0014 |
| | | | | 424/70.13 |
| 2012/0218003 A1* | 8/2012 | Olson | .................... | G01R 19/04 |
| | | | | 327/72 |
| 2014/0032942 A1 | 1/2014 | Takehara et al. | | |
| 2014/0253065 A1* | 9/2014 | Brown | .................. | H02M 3/158 |
| | | | | 323/272 |

* cited by examiner

| | $t_R$ [μs] | $t_F$ [μs] | $V_{OUT\_PK}$ [mV] | $V_{OVERSHOOT}$ [mV] | Overshoot [%] |
|---|---|---|---|---|---|
| Original | 1.18 | 10 | 1210 | 110.00 | 10 |
| MOSFET Rds Control (20Ω) | 0.64 | 8.24 | 1145 | 44.77 | 4.07 |
| Adding a Series Resistor (1Ω) | 0.64 | 8.24 | 1134 | 33.24 | 2.9 |

FIG. 8

SYSTEM AND METHOD FOR OUTPUT VOLTAGE OVERSHOOT SUPPRESSION

CROSS-REFERENCE TO RELATED APPLICATIONS

The present application claims the benefit under 35 U.S.C. § 119(e) of U.S. Provisional Application Ser. No. 62/399,649, filed Sep. 26, 2016, and titled "SYSTEM AND METHOD FOR OUTPUT VOLTAGE OVERSHOOT SUPPRESSION," which is incorporated herein by reference in its entirety.

BACKGROUND

Voltage regulators are employed to maintain constant or substantially constant voltage levels for one or more components within a system, such as, but not limited to, a computer system (e.g., mobile device (e.g., smartphone, tablet, smartwatch, activity tracker, digital camera, notebook computer, portable media player, portable gaming device, portable storage device, etc.), desktop computer, server, or the like), communication system, power system, control system, electromechanical system, or any combination thereof. A voltage regulator can also be configured to convert an input voltage into a higher or lower output voltage. For example, a voltage regulator can include, but is not limited to, a step up or step down regulator (and/or convertor), such as a step up DC-to-DC regulator/convertor, a step down DC-to-DC regulator/convertor (sometimes referred to as a "Buck regulator" or a "Buck convertor"), or the like. Voltage regulators must keep up with fast load transients in order to avoid lags, data corruption or damage to system components. In particular, voltage overshoots in the voltage response of a step down voltage regulator must be suppressed to prevent lags, data corruption or damage to system components that can occur when operational voltage ranges are exceeded.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

of the low-side transistor channel, in accordance with an example embodiment of the present disclosure.

Figure 5:
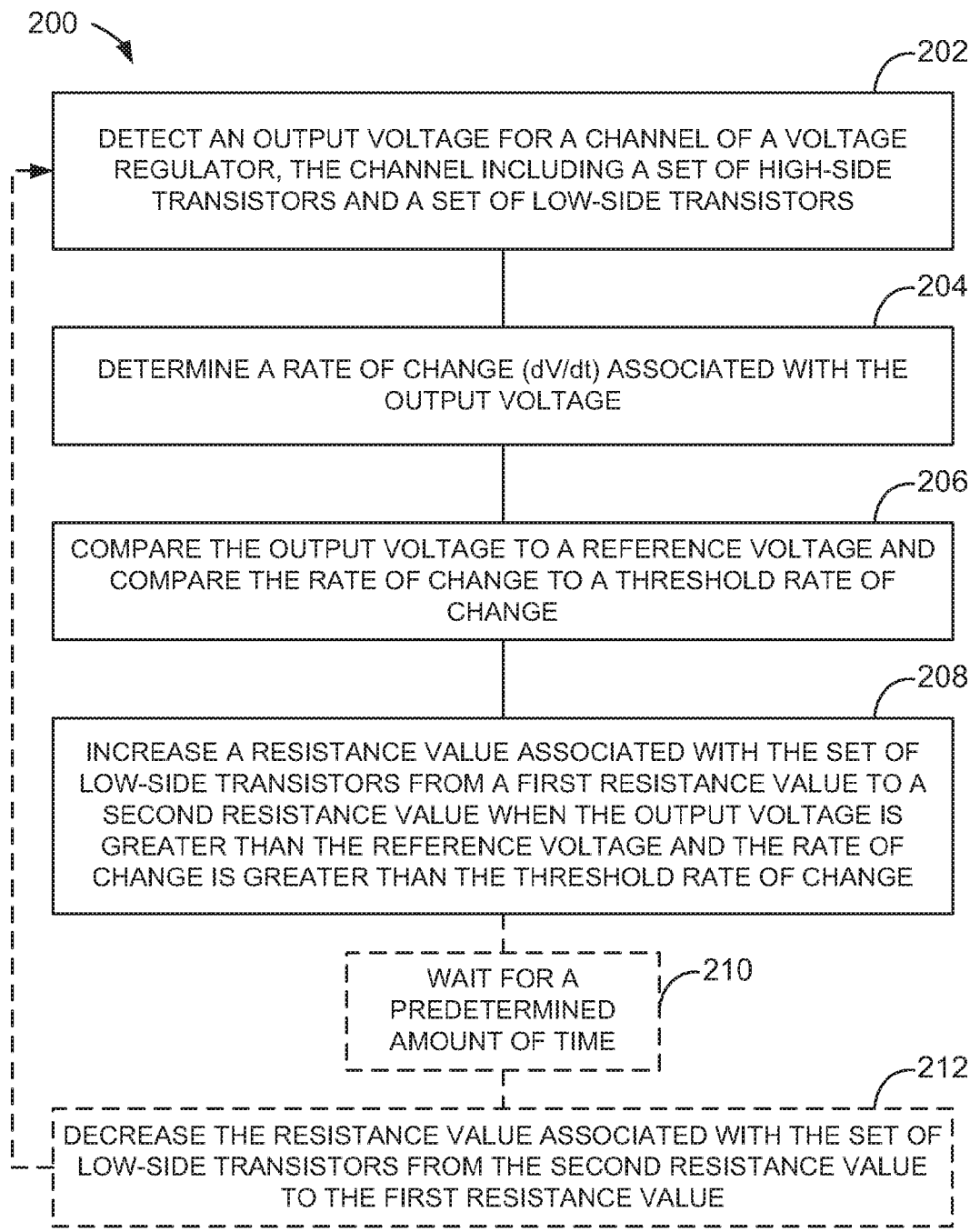

FIG. 5 is a flow diagram illustrating a method of suppressing voltage overshoot for a voltage regulator, such as the voltage regulator illustrated in any of FIGS. 1A through 2C, in accordance with an example implementation of the present disclosure.

Figure 6:
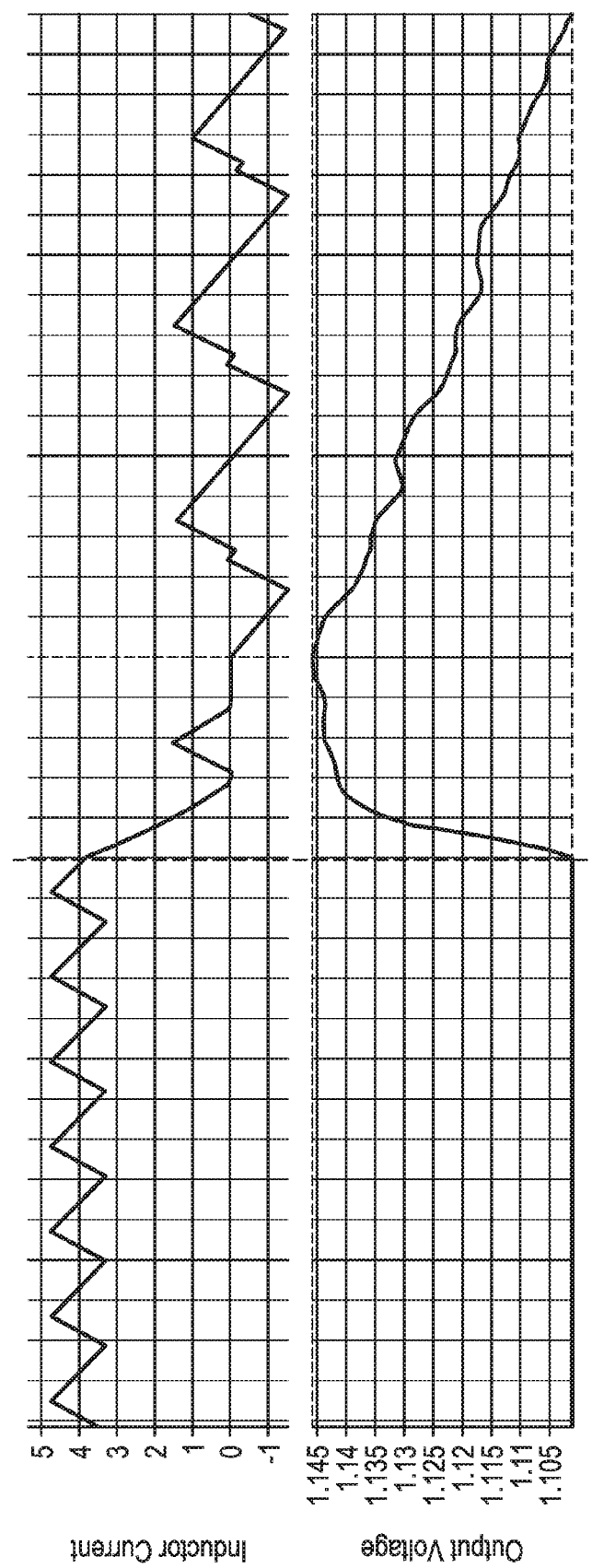

FIG. 6 shows a simulated load transient response for voltage regulator including a system for output voltage overshoot suppression, such as the voltage regulator illustrated in any of FIGS. 1A through 2C, wherein a resistance value associated with at least one set of low-side transistors is 20 ohms, in accordance with an example implementation of the present disclosure.

Figure 7:
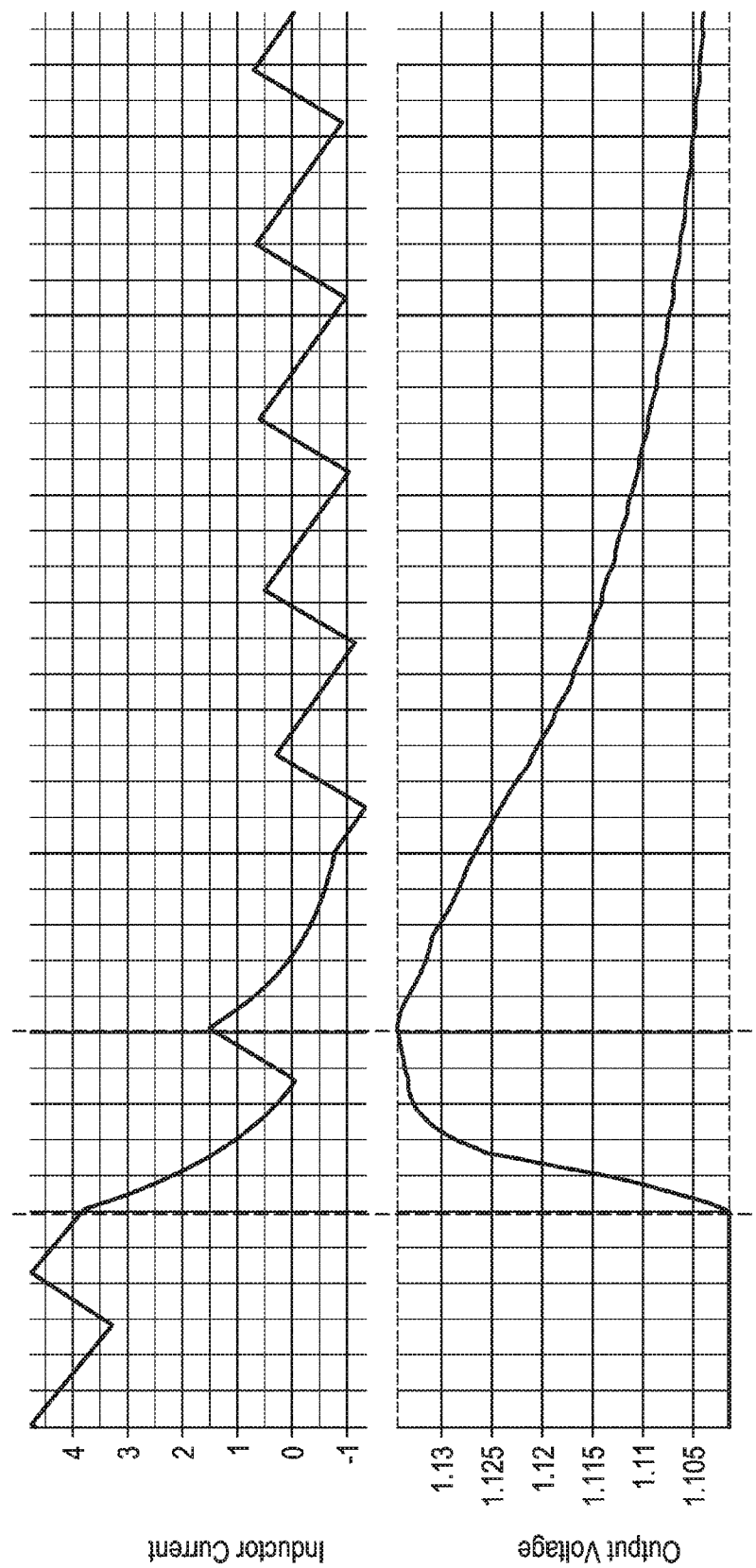

FIG. 7 shows a simulated load transient response for voltage regulator including a system for output voltage overshoot suppression, such as the voltage regulator illustrated in any of FIGS. 1A through 2C, wherein a resistance value associated with at least one set of low-side transistors is 1 ohm, in accordance with an example implementation of the present disclosure.

FIG. 8 shows a table of simulation values for voltage regulator including a system for output voltage overshoot suppression, such as the voltage regulator illustrated in any of FIGS. 1A through 2C, operated with different resistance values associated with at least one set of low-side transistors, in accordance with an example implementation of the present disclosure.

DETAILED DESCRIPTION

Overview

Voltage regulators are employed to maintain constant or substantially constant voltage levels for one or more components within a system, such as, but not limited to, a computer system (e.g., mobile device (e.g., smartphone, tablet, smartwatch, activity tracker, digital camera, notebook computer, portable media player, portable gaming device, portable storage device, etc.), desktop computer, server, or the like), communication system, power system, control system, electromechanical system, or any combination thereof. For example, a system may employ a voltage regulator in order to distribute power from a system power supply to different components of the system that may have different voltage requirements. Some components (e.g., processors, such as application processors, graphics processes, and the like) may require low supply voltage with a high current capability. Multiphase step-down voltage regulators (e.g., interleaved multi-phase Buck regulators) can be used to achieve faster transient response, reduced output voltage ripples, and less hot spots on a printed circuit board or particular components. However, the load current slew-rate (di/dt) requirement of some components (e.g., processors in mobile devices) is high (e.g., sometimes ≥100 A/μs) with large load steps (e.g., sometimes >13 A), while the voltage regulation requirement for such components is very tight (e.g., sometimes less than ±5%). Thus it is advantageous to maintain the output voltage of a voltage regulator within its regulation window, even during fast load transients, in order to prevent lags, data corruption or damage to system components that can occur when operational voltage ranges are exceeded.

When the current load for a channel of a voltage regulator is released from its maximum current ($I_{MAX}$) to its minimum current ($I_{MIN}$) with fast current slew rate (di/dt), the energy stored in the inductor(s) of the channel will be dumped to the output capacitor(s) of the channel in conventional step down voltage regulator (e.g., a conventional Buck regulator). This results in high output voltage overshoot that may go beyond the absolute maximum rating (AMR) of a component (e.g., a processor) in some cases. Additionally, even if the output voltage overshoot of the voltage regulator is lower than the AMR of a component (e.g., a processor), the component may need to wait until the channel's output voltage recovers from high overshoot back to its regulation range, before starting the next load transient. For example, it has be found that output voltage overshoot of a 20 A four-phase Buck regulator can go as high as 133 mV with 1.1V of output voltage setting when the output current changes from 16.1 A to 100 mA with a slew rate of 100 A/μs. In such a case, the output voltage can exceed the AMR of a processor that has, for example, an AMR of 1.21V.

A system and method for suppressing output voltage overshoot are disclosed. In implementations, an inductor current discharge slope is increased for one or more channels of a voltage regulator (e.g., one or more channels of a step down regulator (e.g., Buck regulator)). The current discharge slope is controlled by increasing the voltage across inductor(s) within the one or more voltage regulation channels when fast overshoot (e.g., voltage overshoot above a predetermined threshold) is detected. This can be achieved by increasing voltage across low-side transistors (e.g., MOSFETs) using an adaptive gate control scheme and/or by selectively connecting a resistor in series with the low-side transistors.

Example Implementations

FIGS. 1A through 4 illustrate a voltage regulator 100 in accordance with embodiments of this disclosure. As further described herein, the voltage regulator 100 includes a controller 102 configured to suppress voltage overshoot by controlling one or more components of the voltage regulator 100 (e.g., via an adaptive gate control scheme (as illustrated in FIG. 1C) and/or with a selectively connectable resistive load (as illustrated in FIGS. 2A through 2C)). The voltage regulator 100 may deployed in a system, such as, but not limited to a computer system (e.g., mobile device (e.g., smartphone, tablet, smartwatch, activity tracker, digital camera, notebook computer, portable media player, portable gaming device, portable storage device, etc.), desktop computer, server, or the like), communication system, power system, control system, electromechanical system, or any combination thereof. The voltage regulator 100 is configured to receive an input voltage Vsys and can regulate and/or convert the input voltage Vsys in order to generate an output voltage $V_{OUT}$. For example, the voltage regulator 100 can be configured to provide the output voltage $V_{OUT}$ for one or more components within a system (e.g., for a mobile device controller/processor, graphics controller/processor, communications controller/processor, or the like.

Figure 1A:
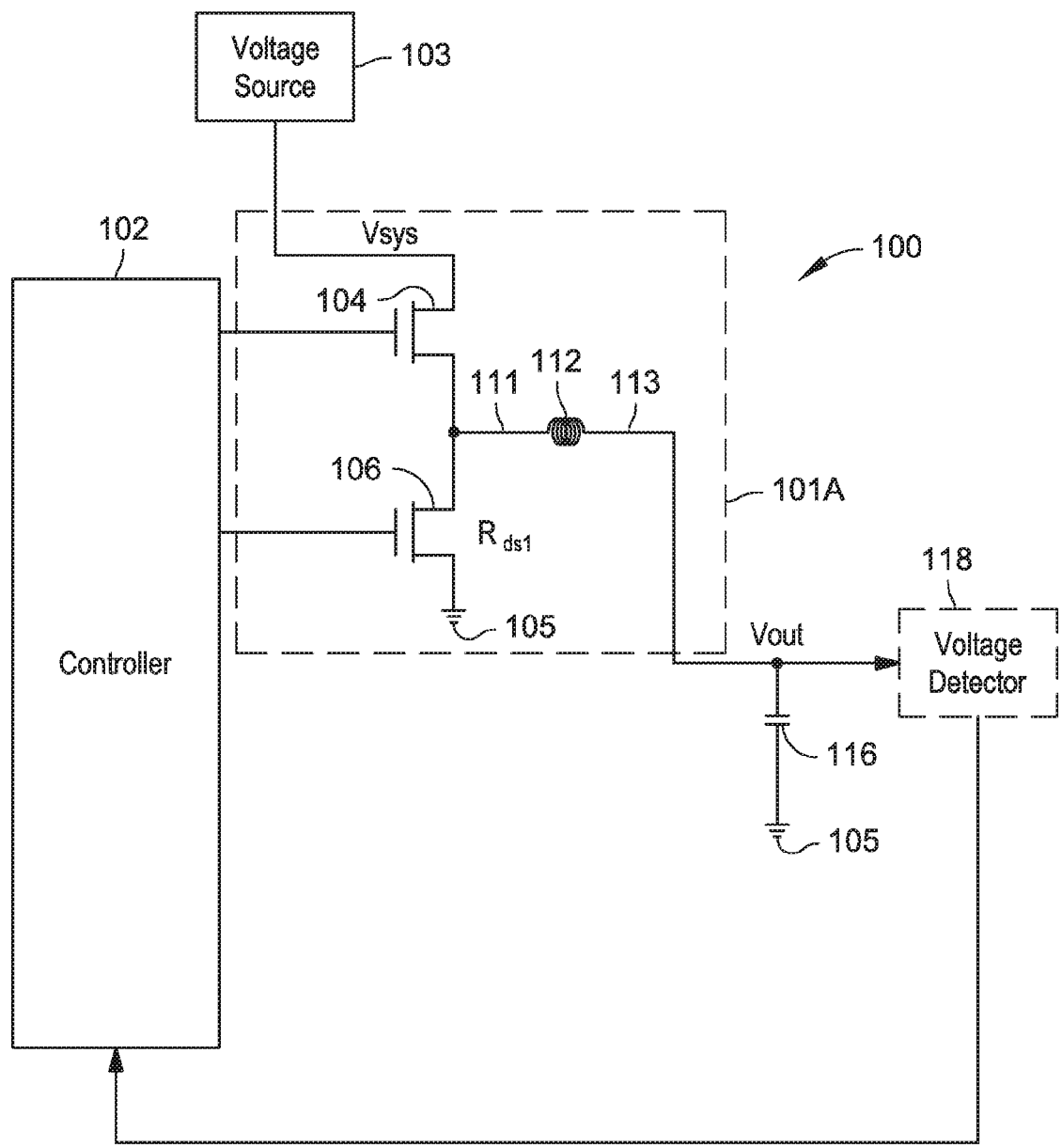
FIG. 1A is a schematic illustrating a voltage regulator including a system for output voltage overshoot suppression, in accordance with an example embodiment of the present disclosure.
Figure 1B:
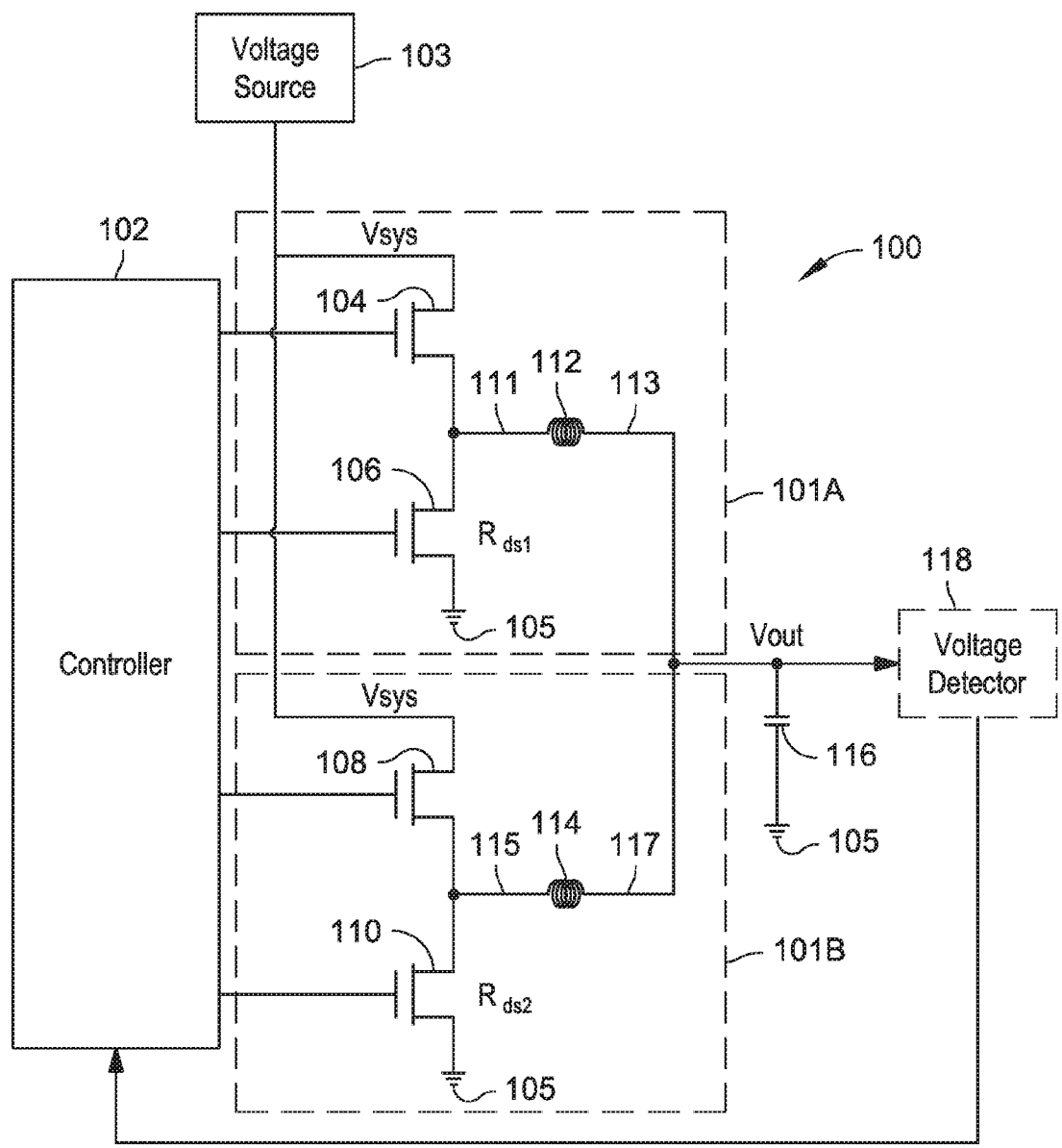
FIG. 1B is a schematic illustrating a multiphase voltage regulator including a system for output voltage overshoot suppression, in accordance with an example embodiment of the present disclosure.
Figure 1C:
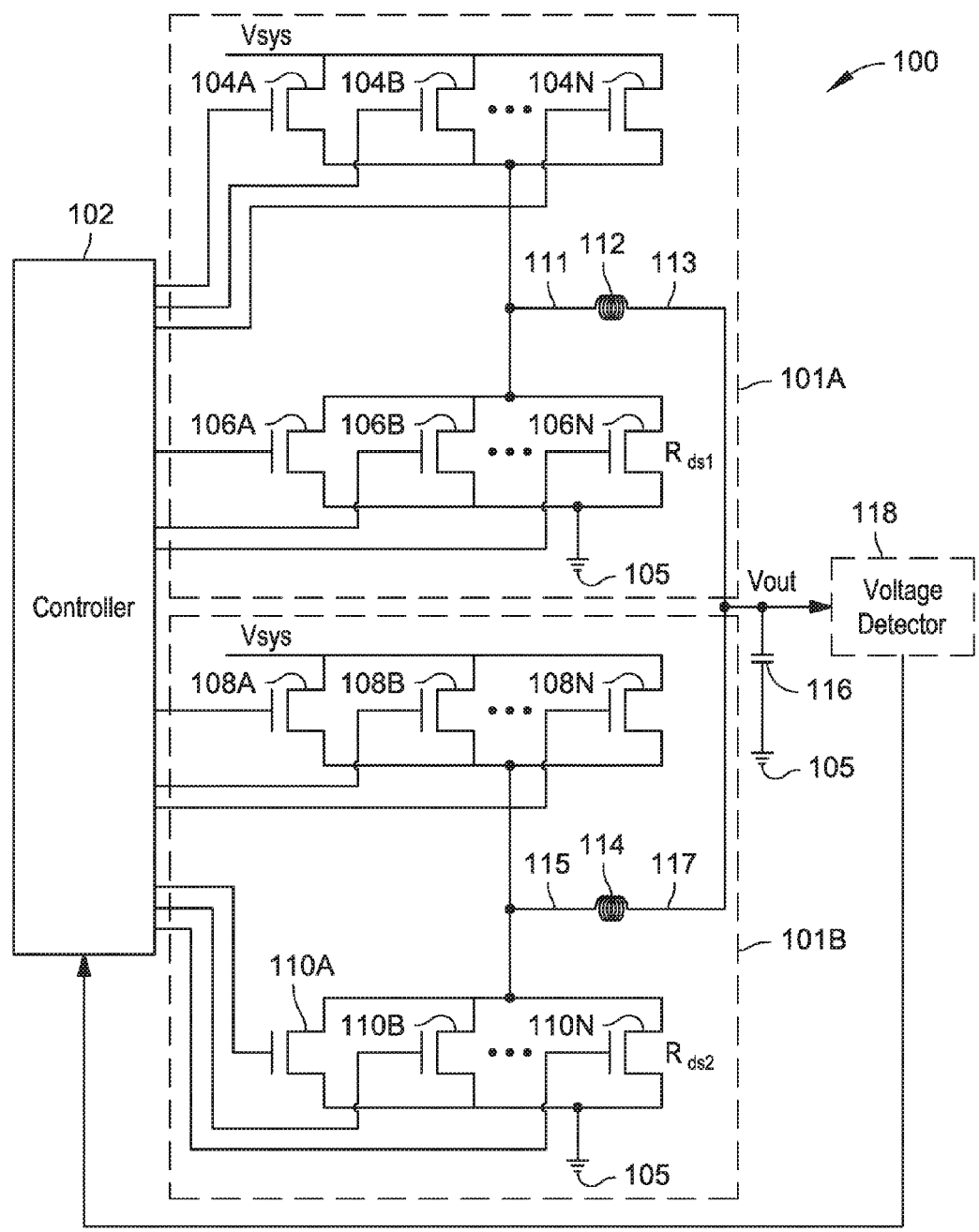
FIG. 1C is a schematic illustrating a voltage regulator, such as the voltage regulator illustrated in FIG. 1A or FIG. 1B, wherein each set of transistors includes one or more transistors that can be selectively activated or deactivated to adjust a resistance value associated with the set of transistors, in accordance with an example embodiment of the present disclosure.
Figure 1D:
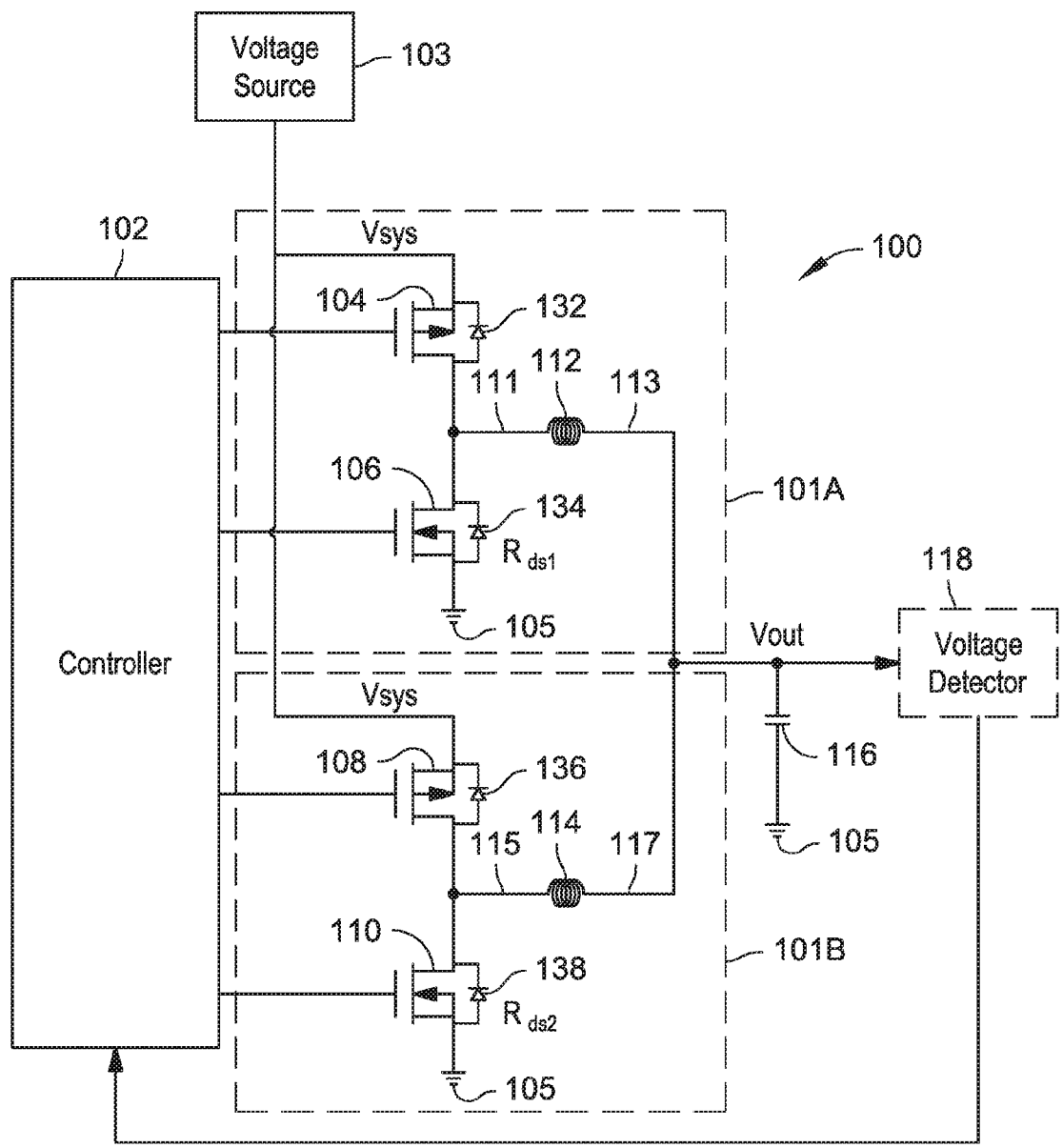
FIG. 1D is a schematic illustrating a voltage regulator, such as the voltage regulator illustrated in FIG. 1A or FIG. 1B, in accordance with an example embodiment of the present disclosure.
Figure 2A:
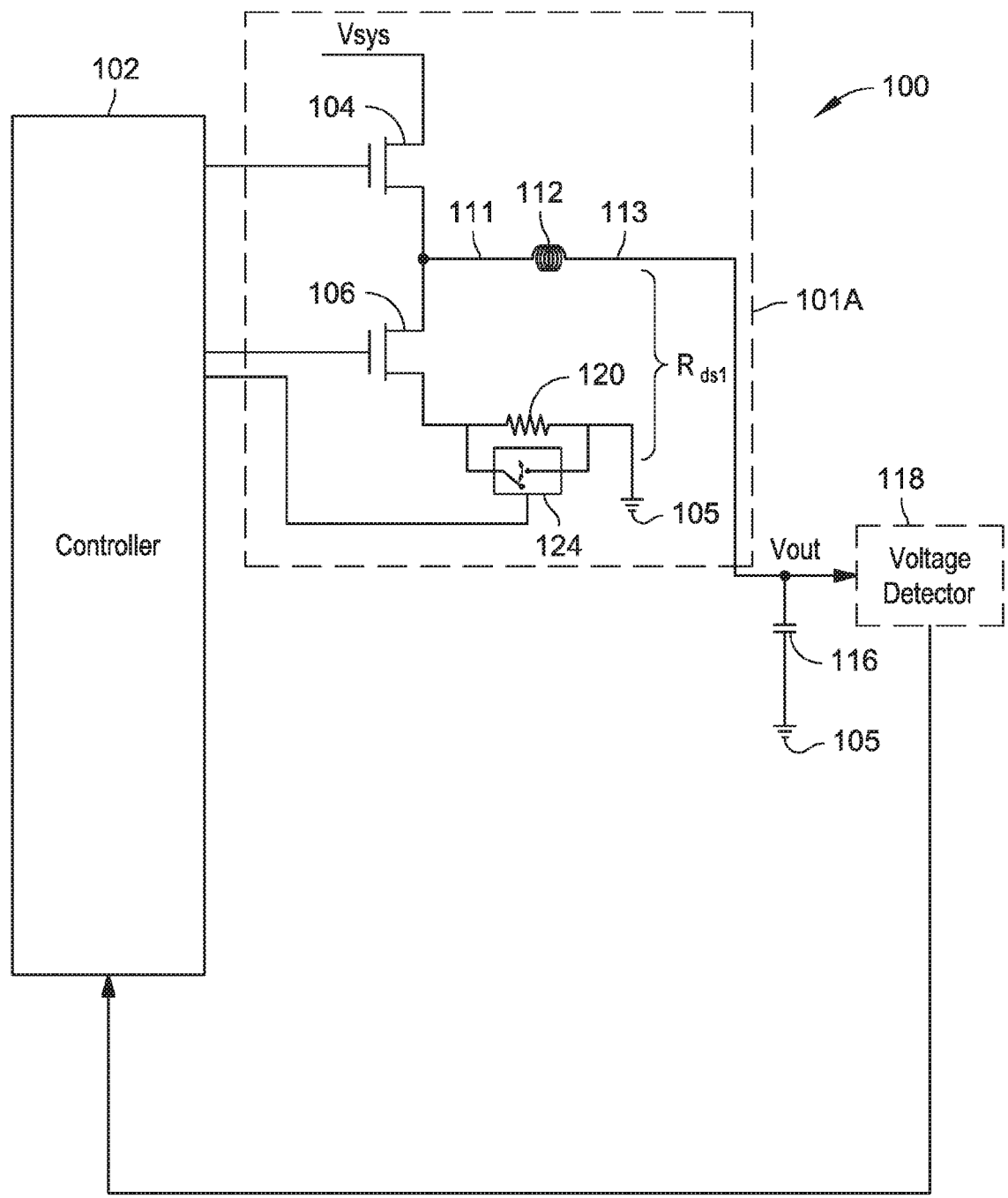
FIG. 2A is a schematic illustrating a voltage regulator including a system for output voltage overshoot suppression, wherein a resistor can be selectively placed in series with at least one set of transistors to adjust a resistance value associated with the set of transistors, in accordance with an example embodiment of the present disclosure.
Figure 2B:
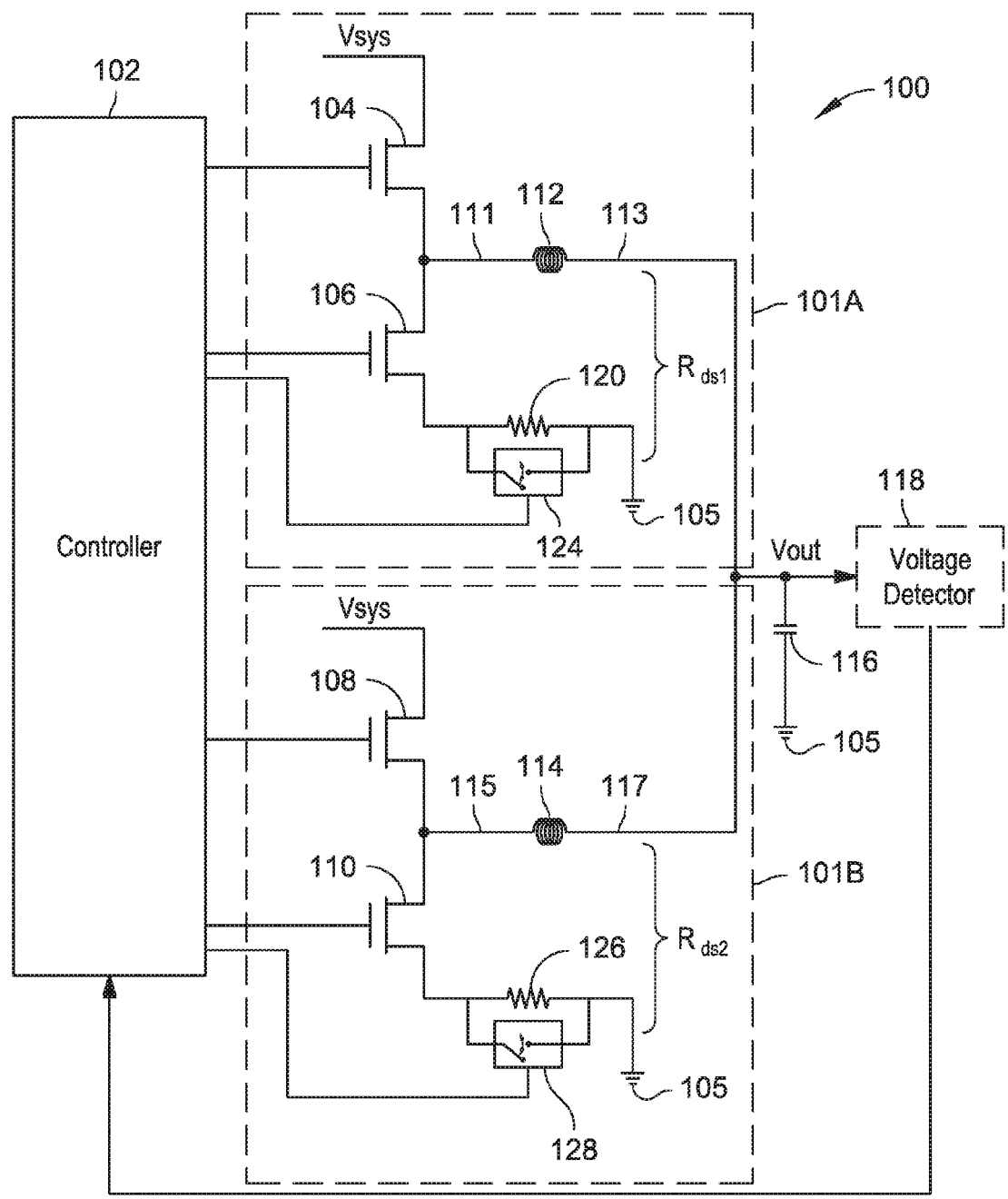
FIG. 2B is a schematic illustrating a multiphase voltage regulator including a system for output voltage overshoot suppression, wherein a resistor can be selectively placed in series with at least one set of transistors to adjust a resistance value associated with the set of transistors, in accordance with an example embodiment of the present disclosure.
Figure 2C:
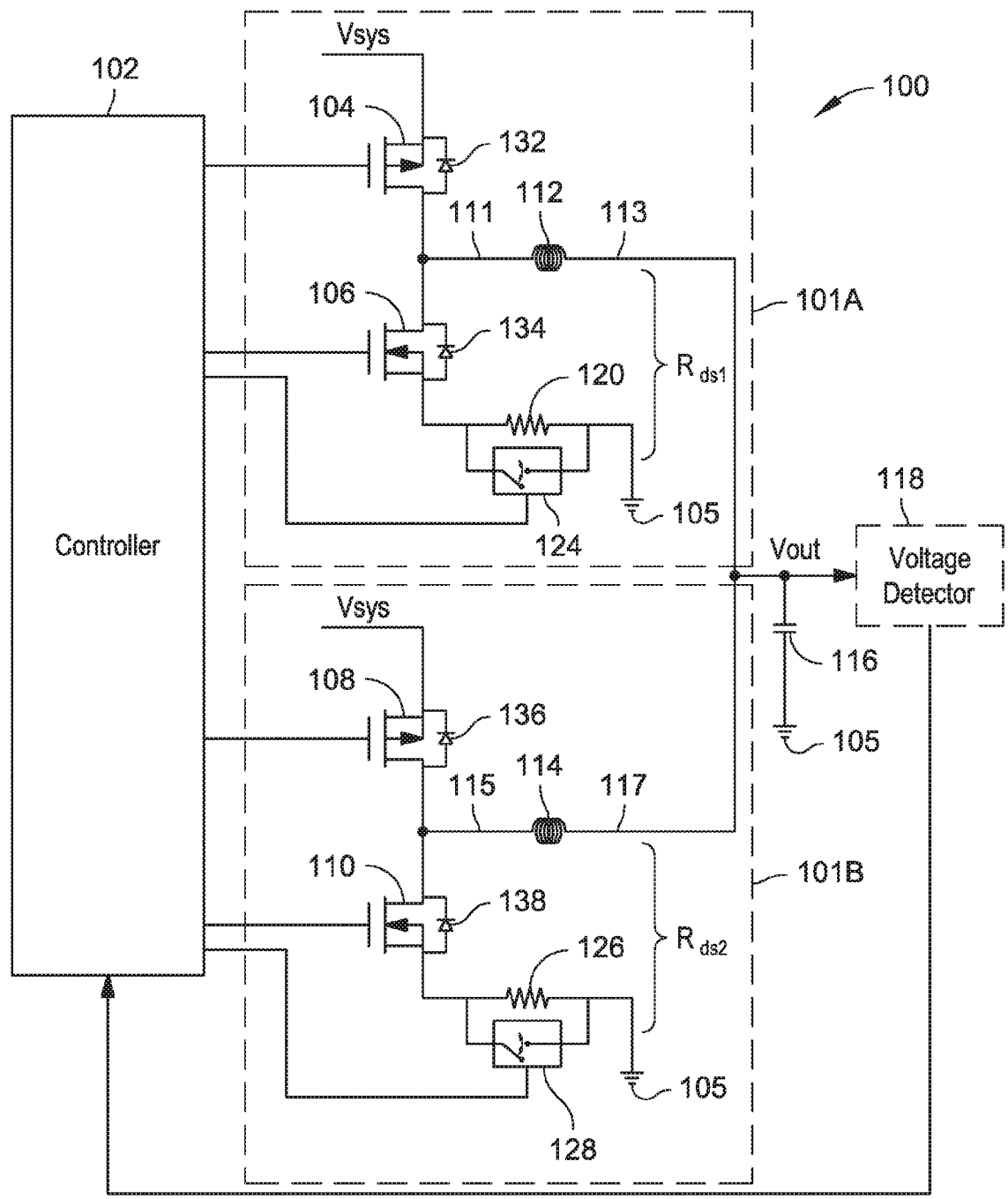
FIG. 2C is a schematic illustrating a voltage regulator, such as the voltage regulator illustrated in FIG. 2A or FIG. 2B, in accordance with an example embodiment of the present disclosure.

As shown in FIGS. 1A and 1B, the voltage regulator 100 includes one or more channels (e.g., voltage regulation channel 101A, voltage regulation channel 101B, etc.). The voltage regulation channel 101A includes at least one inductor 112 having a first end 111 and a second end 113. The first end 111 of the inductor 112 is coupled to a first set of ("high-side") transistors 104 between the inductor 112 and a voltage source 103 that supplies the input voltage Vsys for each channel (e.g., channel 101A and 101B) of the voltage regulator 100. For example, the voltage source 103 can include, but is not limited to, a power supply unit, a generator, an energy storage device (e.g., battery), a power distribution circuit (e.g., power management integrated circuit (PMIC)), a combination thereof, or the like. In some embodiments, the voltage regulator 100 includes a body diode 132 in parallel with the high-side transistors 104 (e.g., as shown in FIGS. 1D and 2C). The first end 111 of the inductor 112 is also coupled to a second set of ("low-side") transistors 106 between the inductor 112 and an electrical ground 105. In some embodiments, the voltage regulator 100 includes a body diode 134 in parallel with the low-side transistors 106 (e.g., as shown in FIGS. 1D and 2C). The second end 113 of the inductor 112 is coupled to a capacitor 116 associated with an output voltage Vout of the voltage regulator 100. For example, the output voltage Vout can be the voltage across the capacitor 116.

The voltage regulator 100 can include any number of channels (e.g., a single channel (e.g., channel 101A, as shown in FIG. 1A), two channels (e.g., channels 101A and 101B, as shown in FIG. 1B), three channels, four channels, and so forth). In some embodiments, where the voltage regulator 100 includes a plurality of voltage regulation channels, as shown in FIG. 1B, the voltage regulation channels (e.g., channels 101A, 101B, etc.) are similarly configured. For example, in the embodiment shown in FIG. 1B, voltage regulation channel 101B also includes at least one inductor 114 having a first end 115 and a second end 117. The first end 115 of the inductor 114 is coupled to a set of high-side transistors 108 between the inductor 114 and the voltage source 103. In some embodiments, the high-side transistors 108 also have a body diode 136 in parallel with the high-side transistors 108 (e.g., as shown in FIGS. 1D and 2C). The first end 115 of the inductor 114 is also coupled to a set of low-side transistors 110 between the inductor 114 and an electrical ground 105. In some embodiments, the low-side transistors 110 also have a body diode 138 in parallel with the high-side transistors 108 (e.g., as shown in FIGS. 1D and 2C). The second end 115 of the inductor 114 is coupled to the capacitor 116 associated with the output voltage Vout of the voltage regulator 100. In this regard, the inductors 112 and 114 both feed respective output signals for the voltage regulator 110, and as such, the output voltage Vout is based upon the output signal from inductor 112, the output signal from inductor 114, or a combination of the output signal from inductor 112 and the output signal from inductor 114.

The transistors (e.g., low-side transistors 106, 110 and high-side transistors 104, 108, and so forth) can include any transistor type. For example, the transistors may include, but are not limited to, field-effect transistors (FETs) (e.g., metal-oxide-semiconductor field-effect transistors (MOSFETs), bipolar junction transistors (BJTs), a combination thereof, or the like. In some embodiments, the low-side transistors (e.g., transistors 106 and/or 110) are NMOS transistors and the high-side transistors (e.g., transistors 104 and/or 108) are PMOS transistors (e.g., as shown in FIGS. 1D and 2C).

The voltage regulator 100, including some or all of its components, can operate under computer control. For example, a processor 130 can be included with or in a controller 102 to control the components and functions of the voltage regulator 100 described herein using software, firmware, hardware (e.g., fixed logic circuitry), manual processing, or a combination thereof. In some embodiments, the controller 102 is a multiphase controller. The terms "controller," "functionality," "service," and "logic" as used herein generally represent software, firmware, hardware, or a combination of software, firmware, or hardware in conjunction with controlling the voltage regulator 100. In the case of a software implementation, the module, functionality, or logic represents program code (e.g., algorithms embodied in a non-transitory computer readable medium) that performs specified tasks when executed on a processor (e.g., central processing unit (CPU) or CPUs). The program code can be stored in one or more non-transitory computer-readable memory devices or media (e.g., internal memory and/or one or more tangible media), and so on. For example, memory may include but is not limited to volatile memory, non-volatile memory, Flash memory, SRAM, DRAM, RAM and ROM. The structures, functions, approaches, and techniques described herein can be implemented on a variety of commercial computing platforms having a variety of processors.

Figure 3:
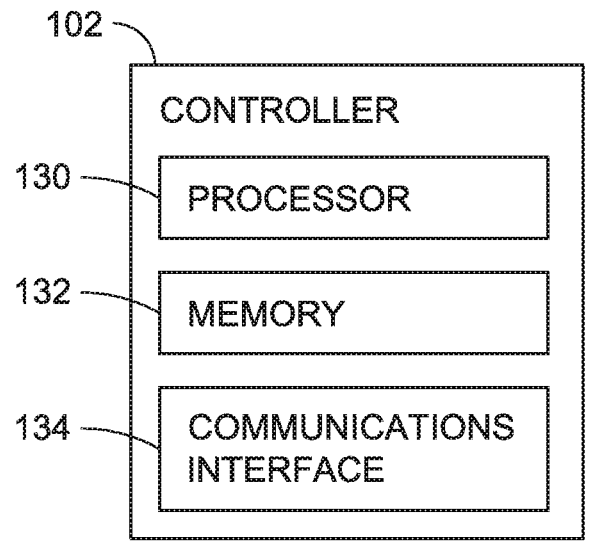
FIG. 3 is a block diagram illustrating a controller for a voltage regulator, such as the voltage regulator illustrated in any of FIGS. 1A through 2C, in accordance with an example embodiment of the present disclosure.

As shown in FIG. 3, the controller 102 can include a processor 130, a memory 132, and a communications interface 134. The processor 130 provides processing functionality for at least the controller 102 and can include any number of processors, micro-controllers, circuitry, field programmable gate array (FPGA) or other processing systems, and resident or external memory for storing data, executable code, and other information accessed or generated by the controller 102. The processor 130 can execute one or more software programs embodied in a non-transitory computer readable medium that implement techniques described herein. The processor 130 is not limited by the materials from which it is formed or the processing mechanisms employed therein and, as such, can be implemented via semiconductor(s) and/or transistors (e.g., using electronic integrated circuit (IC) components), and so forth.

The controller 102 may include a memory 132 (e.g., Flash memory, RAM, SRAM, DRAM, ROM, etc.). The memory 132 can be an example of tangible, computer-readable storage medium that provides storage functionality to store various data and or program code associated with operation of the controller 102, such as software programs and/or code segments, or other data to instruct the processor 130, and possibly other components of the voltage regulator 100/controller 102, to perform the functionality described herein. Thus, the memory 132 can store data, such as a program of instructions for operating the voltage regulator 100 (including its components), and so forth. It should be noted that while a single memory 132 is described, a wide variety of types and combinations of memory (e.g., tangible, non-transitory memory) can be employed. The memory 132 can be integral with the processor 130, can comprise stand-alone memory, or can be a combination of both.

Some examples of the memory 132 can include removable and non-removable memory components, such as random-access memory (RAM), read-only memory (ROM), flash memory (e.g., a secure digital (SD) memory card, a mini-SD memory card, and/or a micro-SD memory card), magnetic memory, optical memory, universal serial bus (USB) memory devices, hard disk memory, external memory, and so forth. In implementations, the voltage regulator 100 and/or the memory 132 can include removable integrated circuit card (ICC) memory, such as memory provided by a subscriber identity module (SIM) card, a universal subscriber identity module (USIM) card, a universal integrated circuit card (UICC), and so on.

The controller 102 may include a communications interface 134. The communications interface 134 can be operatively configured to communicate with components of the voltage regulator 100. For example, the communications interface 134 can be configured to transmit data for storage in the voltage regulator 100, retrieve data from storage in the voltage regulator 100, and so forth. The communications interface 134 can also be communicatively coupled with the processor 130 to facilitate data transfer between components of the voltage regulator 100 and the processor 130 (e.g., for communicating inputs to the processor 130 received from a device communicatively coupled with the voltage regulator 100/controller 102). It should be noted that while the communications interface 134 is described as a component of controller 102, one or more components of the communications interface 134 can be implemented as external components communicatively coupled to the voltage regulator 100 via a wired and/or wireless connection. The voltage regulator 100 can also include and/or connect to one or more input/output (I/O) devices (e.g., via the communications interface 134), such as a display, a mouse, a touchpad, a touchscreen, a keyboard, a microphone (e.g., for voice commands) and so on.

The controller 102 is communicatively coupled to the one or more voltage regulation channels (e.g., channel 101A and/or channel 101B) of the voltage regulator 100. The controller 102 is configured to determine whether the output voltage Vout is greater than a reference voltage (e.g., a supplied reference voltage (e.g., from a reference voltage source) or a predetermined reference voltage) and whether a rate of change $$\left(\frac{dV}{dt}\right)$$

(e.g., slew rate) associated with the output voltage Vout is greater than a threshold rate of change (e.g., a predetermined rate of change for the voltage regulator 100). In some embodiments, the controller 102 is configured to detect the output voltage Vout directly. For example, the controller 102 can receive the output voltage Vout at an input of the controller 102. In other embodiments, the voltage regulator 100 can include a voltage detector 118 configured to detect the output voltage Vout and transmit a signal associated with the output voltage Vout to the controller 102. In an embodiment, the voltage detector 118 can include an analog-to-digital converter (ADC) configured to convert the output voltage Vout to a digital value that is transmitted to the controller 102, where the controller 102 is configured to compare the digital value for the output voltage Vout to a stored digital value for the reference voltage. In another embodiment, the voltage detector 118 can include a comparator configured to compare the output voltage Vout to a reference voltage (e.g., from a reference voltage source), where the controller 102 is then configured to receive a signal from the voltage detector 118 indicating whether the output voltage Vout is greater than the reference voltage or not.

The controller 102 is further configured to increase a resistance value (e.g., $R_{ds1}$ or $R_{ds2}$) associated with the low-side transistors (e.g., transistors 106 or transistors 110) of a respective voltage regulation channel (e.g., channel 101A or channel 101B) from a first resistance value to a second resistance value when the output voltage Vout is greater than the reference voltage and the rate of change $$\left(\frac{dV}{dt}\right)$$

associated with the output voltage Vout is greater than the threshold rate of change. In some embodiments, the controller 102 is configured to change the resistance value (e.g., $R_{ds1}$ or $R_{ds2}$) associated with the low-side transistors (e.g., transistors 106 or 110) of one channel (e.g., channel 101A or 101B) based on whether the output voltage Vout is based on an output signal from that channel (e.g., channel 101A or 101B). In other embodiments, the controller 102 is configured to change the resistance value associated with the low-side transistors of a plurality of channels or all of the voltage regulation channels simultaneously.

In some embodiments, the controller 102 is configured to implement an adaptive gate control scheme. For example, as shown in FIG. 1C, the controller 102 can be configured to increase the resistance value (e.g., $R_{ds1}$ and/or $R_{ds2}$) associated with the low-side transistors (e.g., transistors 106 and/or 110) of one or more channels (e.g., channel 101A and/or 101B) from the first resistance value to the second resistance value (or from different respective first resistance values to respective second resistance values for each channel) by deactivating a subset of the low-side transistors (e.g., one or more of transistors 106A, 106B, ... 106N and/or one or more of transistors 110A, 110B, ... 110N). For example, the controller 102 can increase/decrease or turn on/off the gate voltage applied for the subset of the low-side transistors (e.g., one or more of transistors 106A, 106B, ... 106N and/or one or more of transistors 110A, 110B, ... 110N).

In some embodiments, the controller 102 is additionally or alternatively configured to adjust the resistance value (e.g., $R_{ds1}$ and/or $R_{ds2}$) for one or more channels (e.g., channel 101A and/or 101B) by selectively placing a resistive load in series with the low-side transistors (e.g., transistors 106 and/or 110) of one or more channels (e.g., channel 101A and/or 101B) of the voltage regulator 100. For example, as shown in FIG. 2A, voltage regulation channel 101A can include a resistor 120 that is coupled to the low-side transistors 106. The voltage regulation channel 101A can further include an electronic switch 124 coupled to the resistor 120 and the low-side transistors 106. The electronic switch 124 can be configured to toggle between a first state (e.g., closed position) where the resistor 124 is bypassed and a second state (e.g., open position) where the resistor is placed in a series configuration with the low-side transistors 106. Similarly, e.g., as shown in FIG. 2B, voltage regulation channel 101B (and any other channels) can include a respective resistor 126 and electronic switch 128 that operate in the same manner as resistor 120 and electronic switch 124. The controller 102 can be configured to increase the resistance value or values (e.g., $R_{ds1}$ and/or $R_{ds2}$) for one or more channels (e.g., channel 101A and/or 101B) from a first resistance value to a second resistance value by toggling the electronic switch (e.g., electronic switch 124 and/or 128) from the first state to the second state.

Figure 4:
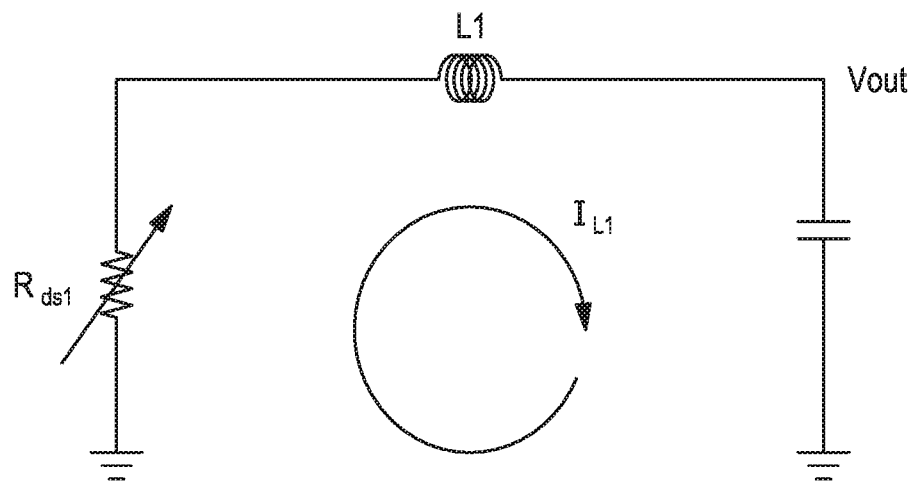
FIG. 4 is a schematic illustrating a current path through a low-side transistor channel of a voltage regulator, such as the voltage regulator illustrated in any of FIGS. 1A through 2C, wherein a resistance value associated with a respective set of low-side transistors is adjustable to affect an output voltage ($V_{OUT}$) and a current slew rate $$\left(\frac{di}{dt}\right)$$

As shown in FIG. 4, when the resistance value (e.g., $R_{ds1}$) for a voltage regulation channel is increased, the output voltage Vout associated with the channel (e.g., channel 101A) is reduced, thereby quickly suppressing voltage overshoot. For example, the equations below demonstrate the relationship between the output voltage Vout, the current slew rate $$\left(\frac{di}{dt}\right),$$

and the resistance value $R_{ds1}$.

$$Vout = L1\frac{di}{dt} - R_{ds1} \times I_{L1}$$

$$\frac{di}{dt} = \frac{Vout + R_{ds1} \times I_{L1}}{L1}$$

When the low-side transistors (e.g., transistors 106) are turned on, the voltage across inductor L1 (e.g., inductor 112) can be controlled if $R_{ds1}$ is manipulated. If the voltage across the inductor L1 changes, the inductor current slope changes accordingly. As discussed herein, the controller 102 can be configured to manipulate $R_{ds1}$ of low-side transistors 106 by implementing a FET scaling scheme (i.e., selectively deactivating or turning off some of the transistors (e.g., one or more of transistors 106A, 106B, ... 106N). As also discussed herein, the controller 102 may be additionally or alternatively configured to manipulate $R_{ds1}$ by selectively connecting a resistor (e.g., resistor 120) in series with the low-side transistors (e.g., transistors 106).

After an overshoot condition is suppressed by increasing the resistance value (e.g., $R_{ds1}$ and/or $R_{ds2}$) for the low-side transistors (e.g., transistors 106 and/or 110) of one or more channels (e.g., channel 101A and/or 101B) of the voltage regulator 100, the controller 102 may be configured to decrease the resistance values (e.g., $R_{ds1}$ and/or $R_{ds2}$). For example, the controller 102 can be configured to reduce resistance value or values (e.g., $R_{ds1}$ and/or $R_{ds2}$) from the respective second resistance value or values back the first respective resistance value or values. In some embodiments, the controller 102 is configured to decrease the resistance value or values (e.g., $R_{ds1}$ and/or $R_{ds2}$) from the respective second resistance value or values back the first respective resistance value or values after a predetermined time period (e.g., in the range of 0.1 to 10 µs, for example, 1 µs) from increasing the resistance value or values (e.g., $R_{ds1}$ and/or $R_{ds2}$) from the respective first resistance value or values to the second respective resistance value or values. In other embodiments, the controller 102 is configured to decrease the resistance value or values (e.g., $R_{ds1}$ and/or $R_{ds2}$) from the respective second resistance value or values back the first respective resistance value or values after detecting and/or determining that the output voltage Vout is less than the reference voltage and the rate of change $$\left(\frac{dV}{dt}\right)$$

associated with the output voltage Vout is less than the threshold rate of change. The controller 102 can be configured to decrease the resistance value (e.g., $R_{ds1}$ and/or $R_{ds2}$) associated with the low-side transistors (e.g., transistors 106 and/or 110) of one or more channels (e.g., channel 101A and/or 101B) from the second resistance value to the first resistance value (or from different respective first resistance values to respective second resistance values for each channel) by reactivating a (previously deactivated) subset of the low-side transistors (e.g., one or more of transistors 106A, 106B, . . . 106N and/or one or more of transistors 110A, 110B, . . . 110N). In another embodiment, the controller 102 is additionally or alternatively configured to decrease the resistance value (e.g., $R_{ds1}$ and/or $R_{ds2}$) associated with the low-side transistors (e.g., transistors 106 and/or 110) of one or more channels (e.g., channel 101A and/or 101B) from the second resistance value to the first resistance value (or from different respective first resistance values to respective second resistance values for each channel) by toggling an electronic switch (e.g., electronic switch 124 and/or 128) from a second state (e.g., open position) to the first state (e.g., closed position) to bypass a resistor (e.g., resistor 120 and/or resistor 126) so that the resistor is no longer in series with a respective set of low-side transistors (e.g., transistors 106 and/or 110).

In the manner described above, the voltage regulator 100 can suppress a voltage overshoot and then resume operation under conditions existing prior to detecting an overshoot condition. The controller 102 can continue to monitor Vout and $$\left(\frac{dV}{dt}\right)$$

to detect additional overshoot conditions and can be configured to suppress any other detected overshoot conditions in the same manner as described above. In some embodiments, the controller 102 is configured to wait for a blanking time before continuing to monitor Vout and $$\left(\frac{dV}{dt}\right).$$

For example, the blanking time can be between 0.1 to 10 µs (e.g., 5 µs). The foregoing times are provided by way of example and are not intended as limitations on the present disclosure unless otherwise indicated herein. For example, the predetermined (overshoot suppression) time and blanking time discussed herein can be any time value appropriate for an implementation of the voltage regulator 100 described herein.

Example Process(es)

FIG. 5 illustrates an example process 200 for suppressing voltage overshoot at an output of a voltage regulator, such as the voltage regulator 100 shown in any of FIGS. 1A through 2C. In general, operations of disclosed processes (e.g., process 200) may be performed in an arbitrary order, unless otherwise provided in the claims.

In an implementation of the method 200, an output voltage (e.g., Vout) at an output of at least one channel (e.g., channel 101A and/or channel 101B) of a voltage regulator (e.g., voltage regulator 100) is detected (block 202). For example, the controller 102 and/or the voltage detector 118 can detect the output voltage Vout. A rate of change $$\left(\frac{dV}{dt}\right)$$

associated with the output voltage Vout is also detected or otherwise determined (block 204). For example, the controller 102 can be configured to determine the rate of change $$\left(\frac{dV}{dt}\right)$$

based on detecting the output voltage Vout at multiple times.

The output voltage Vout is compared with a reference voltage, and the rate of change $$\left(\frac{dV}{dt}\right)$$

is compared with a threshold rate of change (block 206). In some implementations, the controller 102 is configured to perform both comparisons. For example, the controller 102 can be configured to compare the output voltage Vout with the reference voltage and the rate of change $$\left(\frac{dV}{dt}\right)$$

with the reference rate of change. In other implementations, at least one of the comparisons is performed by another component. For example, a voltage detector 118 can be configured to compare the output voltage Vout to a reference voltage (e.g., from a reference voltage source), where the controller 102 is then configured to receive a signal from the voltage detector 118 indicating whether the output voltage Vout is greater than the reference voltage or not.

When the output voltage Vout is greater than the reference voltage and the rate of change $$\left(\frac{dV}{dt}\right)$$

is greater than the threshold rate of change, a resistance value (e.g., $R_{ds1}$ or $R_{ds2}$) associated with a set of low-side transistors (e.g., transistors 106 or transistors 110) for the voltage regulator 100 is increased from a first resistance value to a second resistance value to prevent the output voltage Vout from overshooting and/or to suppress an output voltage overshoot (block 208). For example, the controller 102 can be configured to increase a resistance value (e.g., $R_{ds1}$ or $R_{ds2}$) associated with the low-side transistors (e.g., transistors 106 or transistors 110) of a respective voltage regulation channel (e.g., channel 101A or channel 101B) from a first resistance value to a second resistance value when the output voltage Vout is greater than the reference voltage and the rate of change $$\left(\frac{dV}{dt}\right)$$

associated with the output voltage Vout is greater than the threshold rate of change. In some embodiments, the controller 102 can be configured to increase the resistance value (e.g., $R_{ds1}$ and/or $R_{ds2}$) associated with the low-side transistors (e.g., transistors 106 and/or 110) of one or more channels (e.g., channel 101A and/or 101B) from the first resistance value to the second resistance value (or from different respective first resistance values to respective second resistance values for each channel) by deactivating a subset of the low-side transistors (e.g., one or more of transistors 106A, 106B, . . . 106N and/or one or more of transistors 110A, 110B, . . . 110N). In some embodiments, the controller 102 may additionally or alternatively configured to adjust the resistance value (e.g., $R_{ds1}$ and/or $R_{ds2}$) for one or more channels (e.g., channel 101A and/or 101B) by selectively placing a resistive load in series with the low-side transistors (e.g., transistors 106 and/or 110) of one or more channels (e.g., channel 101A and/or 101B) of the voltage regulator 100. For example, the controller 102 can be configured to increase the resistance value or values (e.g., $R_{ds1}$ and/or $R_{ds2}$) for one or more channels (e.g., channel 101A and/or 101B) from a first resistance value to a second resistance value by toggling an electronic switch (e.g., electronic switch 124 and/or 128) from the first state to the second state, thereby causing at least one resistor (e.g., resistor 120 and/or resistor 126) to be placed in a series configuration with the low-side transistors (e.g., transistors 106 and/or 110).

After an overshoot condition is suppressed by increasing the resistance value (e.g., $R_{ds1}$ and/or $R_{ds2}$) for the low-side transistors (e.g., transistors 106 and/or 110) of one or more channels (e.g., channel 101A and/or 101B) of the voltage regulator 100, the resistance value or values (e.g., $R_{ds1}$ and/or $R_{ds2}$) may be decreased from the respective second resistance value or values back the first respective resistance value or values (block 212). In some implementations, the resistance value or values (e.g., $R_{ds1}$ and/or $R_{ds2}$) may be decreased from the respective second resistance value or values back the first respective resistance value or values after a predetermined time period (e.g., in the range of 0.1 to 10 μs, for example, 1 μs) from increasing the resistance value or values (e.g., $R_{ds1}$ and/or $R_{ds2}$) from the respective first resistance value or values to the second respective resistance value or values (block 210). In other implementations, the resistance value or values (e.g., $R_{ds1}$ and/or $R_{ds2}$) can be decreased from the respective second resistance value or values back the first respective resistance value or values after detecting and/or determining that the output voltage Vout is less than the reference voltage and the rate of change $$\left(\frac{dV}{dt}\right)$$

associated with the output voltage Vout is less than the threshold rate of change. The controller 102 can be configured to decrease the resistance value (e.g., $R_{ds1}$ and/or $R_{ds2}$) associated with the low-side transistors (e.g., transistors 106 and/or 110) of one or more channels (e.g., channel 101A and/or 101B) from the second resistance value to the first resistance value (or from different respective first resistance values to respective second resistance values for each channel) by reactivating a (previously deactivated) subset of the low-side transistors (e.g., one or more of transistors 106A, 106B, . . . 106N and/or one or more of transistors 110A, 110B, . . . 110N). In another implementation, the controller 102 may be additionally or alternatively configured to decrease the resistance value (e.g., $R_{ds1}$ and/or $R_{ds2}$) associated with the low-side transistors (e.g., transistors 106 and/or 110) of one or more channels (e.g., channel 101A and/or 101B) from the second resistance value to the first resistance value (or from different respective first resistance values to respective second resistance values for each channel) by toggling an electronic switch (e.g., electronic switch 124 and/or 128) from a second state (e.g., open position) to the first state (e.g., closed position) to bypass a resistor (e.g., resistor 120 and/or resistor 126) so that the resistor is no longer in series with a respective set of low-side transistors (e.g., transistors 106 and/or 110).

FIG. 6 shows a transient response for a simulation of the voltage regulator 100 employing a 20 ohm resistance change with an adaptive transistor gate control scheme (e.g., by selectively deactivating one or more low-side transistors), where it is shown that the output voltage overshoot was suppressed to approximately 44 mV (e.g., from approximately 110 mV when no overshoot suppression is applied). FIG. 7 shows a transient response for a simulation of the voltage regulator 100 employing a 1 ohm resistance change with a resistive load that is selectively placed in series with the low-side transistors, where it is shown that the output voltage overshoot was suppressed to approximately 33 mV (e.g., from approximately 110 mV when no overshoot suppression is applied). FIG. 8 shows a table with simulation results for an original (e.g., no overshoot suppression) implementation of the voltage regulator 100, simulation results for an adaptive transistor gate control scheme implementation of the voltage regulator 100 (e.g., FIG. 6 results), and simulation results for an implementation of the voltage regulator 100 with a resistive load that is selectively switched into a series configuration with the low-side transistors (e.g., FIG. 7 results). As demonstrated in the implementations described herein, an output voltage overshoot during a load transient can be mitigated by controlling the voltage across the inductor (e.g., inductor 112, 114) for a respective channel (e.g., channel 101A, 101B) of the voltage regulator 100.

Generally, any of the functions described herein can be implemented using hardware (e.g., fixed logic circuitry such as integrated circuits), software, firmware, manual processing, or a combination thereof. Thus, the blocks discussed in the above disclosure generally represent hardware (e.g., fixed logic circuitry such as integrated circuits), software, firmware, or a combination thereof. In the instance of a hardware configuration, the various blocks discussed in the above disclosure may be implemented as integrated circuits along with other functionality. Such integrated circuits may include all of the functions of a given block, system, or circuit, or a portion of the functions of the block, system, or circuit. Further, elements of the blocks, systems, or circuits may be implemented across multiple integrated circuits. Such integrated circuits may comprise various integrated circuits, including, but not necessarily limited to: a monolithic integrated circuit, a flip chip integrated circuit, a multichip module integrated circuit, and/or a mixed signal integrated circuit. In the instance of a software implementation, the various blocks discussed in the above disclosure represent executable instructions (e.g., program code) that perform specified tasks when executed on a processor. These executable instructions can be stored in one or more tangible computer readable media. In some such instances, the entire system, block, or circuit may be implemented using its software or firmware equivalent. In other instances, one part of a given system, block, or circuit may be implemented in software or firmware, while other parts are implemented in hardware.

It is to be understood that the present application is defined by the appended claims. Although embodiments of the present application have been illustrated and described herein, it is apparent that various modifications may be made by those skilled in the art without departing from the scope and spirit of this disclosure.

What is claimed is:

1. A method for output voltage overshoot suppression, comprising:
   detecting an output voltage for at least one channel of a voltage regulator, the at least one channel including an inductor having a first end and a second end, the first end coupled to a first set transistors between the inductor and a voltage source, the first end also coupled to a second set of transistors between the inductor and an electrical ground, the second end coupled to a capacitor at an output of the at least one channel;
   determining whether the output voltage is greater than a reference voltage;
   determining a rate of change associated with the output voltage;
   determining whether the rate of change is greater than a threshold rate of change; and
   increasing a resistance value associated with the second set of transistors from a first resistance value to a second resistance value when the output voltage is greater than the reference voltage and the rate of change is greater than the threshold rate of change, wherein the resistance value associated with the second set of transistors is increased from the first resistance value to the second resistance value by switching a resistor into a series configuration with the second set of transistors.

2. The method of claim 1, wherein the resistance value associated with the second set of transistors is increased from the first resistance value to the second resistance value by deactivating a subset of transistors within the second set of transistors.

3. A method for output voltage overshoot suppression, comprising:
   detecting an output voltage for at least one channel of a voltage regulator, the at least one channel including an inductor having a first end and a second end, the first end coupled to a first set transistors between the inductor and a voltage source, the first end also coupled to a second set of transistors between the inductor and an electrical ground, the second end coupled to a capacitor at an output of the at least one channel;
   determining whether the output voltage is greater than a reference voltage;
   determining a rate of change associated with the output voltage;
   determine whether the rate of change is greater than a threshold rate of change;
   increasing a resistance value associated with the second set of transistors from a first resistance value to a second resistance value when the output voltage is greater than the reference voltage and the rate of change is greater than the threshold rate of change; and
   decreasing the resistance value associated with the second set of transistors after a predetermined time period from the increasing of the resistance value associated with the second set of transistors, wherein the resistance value associated with the second set of transistors is decreased from the second resistance value to the first resistance value by bypassing a resistor previously switched into a series configuration with the second set of transistors.

4. The method of claim 1, further comprising:
   decreasing the resistance value associated with the second set of transistors after a predetermined time period from the increasing of the resistance value associated with the second set of transistors.

5. The method of claim 4, wherein the resistance value associated with the second set of transistors in decreased from the second resistance value to the first resistance value.

6. The method of claim 4, wherein the resistance value associated with the second set of transistors is decreased from the second resistance value to the first resistance value by reactivating a previously deactivated subset of transistors within the second set of transistors.

7. The method of claim 3, wherein the resistance value associated with the second set of transistors is increased from the first resistance value to the second resistance value by switching a resistor into a series configuration with the second set of transistors.

8. A voltage regulator, comprising:
   at least one voltage regulation channel including an inductor having a first end and a second end, the first end coupled to a first set of transistors between the inductor and a voltage source, the first end also coupled to a second set of transistors between the inductor and an electrical ground, the second end coupled to a capacitor at an output of the at least one channel;
   a controller communicatively coupled to the at least one voltage regulation channel, the controller configured to:
      determine whether the output voltage is greater than a reference voltage,
      determine whether a rate of change associated with the output voltage is greater than a threshold rate of change,
      determine whether the rate of change is greater than a threshold rate of change, and
      increase a resistance value associated with the second set of transistors from a first resistance value to a second resistance value when the output voltage is greater than the reference voltage and the rate of change is greater than the threshold rate of change;
   a resistor; and
   an electronic switch coupled to the resistor and the second set of transistors, the electronic switch configured to toggle between a first state where the resistor is bypassed and a second state where the resistor is placed in a series configuration with the second set of transistors.

9. The voltage regulator of claim 8, further comprising:
a voltage detector configured to detect the output voltage and compare the output voltage with the reference voltage, the voltage detector further configured to transmit a signal associated with a comparison of the output voltage with the reference voltage to the controller, wherein the controller is configured to determine whether the output voltage is greater than the reference voltage based on the signal received from the voltage detector.

10. The voltage regulator of claim 8, wherein the controller is configured to increase the resistance value associated with the second set of transistors from the first resistance value to the second resistance value by deactivating a subset of transistors within the second set of transistors.

11. The voltage regulator of claim 10, wherein the controller is configured to decrease the resistance value associated with the second set of transistors from the second resistance value to the first resistance value, after a predetermined time period from the increasing of the resistance value associated with the second set of transistors, by reactivating the subset of transistors within the second set of transistors.

12. The voltage regulator of claim 8, wherein the controller is configured to increase the resistance value associated with the second set of transistors from the first resistance value to the second resistance value by toggling the electronic switch from the first state to the second state.

13. The voltage regulator of claim 12, wherein the controller is configured to decrease the resistance value associated with the second set of transistors from the second resistance value to the first resistance value, after a predetermined time period from the increasing of the resistance value associated with the second set of transistors, by toggling the electronic switch from the second state to the first state.

14. A system for output voltage overshoot suppression, comprising:
a detector configured to detect whether an output voltage for at least one channel of a voltage regulator is greater than a reference voltage, the at least one channel including an inductor having a first end and a second end, the first end coupled to a first set of transistors between the inductor and a voltage source, the first end also coupled to a second set of transistors between the inductor and an electrical ground, the second end coupled to a capacitor at an output of the at least one channel;
a controller communicatively coupled with the detector, the controller configured to:
determine a rate of change associated with the output voltage,
determine whether the rate of change is greater than a threshold rate of change, and
increase a resistance value associated with the second set of transistors from a first resistance value to a second resistance value when the output voltage is greater than the reference voltage and the rate of change is greater than the threshold rate of change;
a resistor; and
an electronic switch coupled to the resistor and the second set of transistors, the electronic switch configured to toggle between a first state where the resistor is bypassed and a second state where the resistor is placed in a series configuration with the second set of transistors.

15. The system of claim 14, wherein the controller is configured to increase the resistance value associated with the second set of transistors from the first resistance value to the second resistance value by deactivating a subset of transistors within the second set of transistors.

16. The system of claim 15, wherein the controller is configured to decrease the resistance value associated with the second set of transistors from the second resistance value to the first resistance value, after a predetermined time period from the increasing of the resistance value associated with the second set of transistors, by reactivating the subset of transistors within the second set of transistors.

17. The system of claim 14, wherein the controller is configured to increase the resistance value associated with the second set of transistors from the first resistance value to the second resistance value by toggling the electronic switch from the first state to the second state.

18. The system of claim 17, wherein the controller is configured to decrease the resistance value associated with the second set of transistors from the second resistance value to the first resistance value, after a predetermined time period from the increasing of the resistance value associated with the second set of transistors, by toggling the electronic switch from the second state to the first state.

19. The method of claim 1, wherein the resistance value associated with the second set of transistors is decreased from the second resistance value to the first resistance value by bypassing a resistor previously switched into a series configuration with the second set of transistors.

20. The method of claim 3, wherein the resistance value associated with the second set of transistors is increased from the first resistance value to the second resistance value by deactivating a subset of transistors within the second set of transistors.

21. The method of claim 3, wherein the resistance value associated with the second set of transistors in decreased from the second resistance value to the first resistance value.

22. The method of claim 3, wherein the resistance value associated with the second set of transistors is decreased from the second resistance value to the first resistance value by reactivating a previously deactivated subset of transistors within the second set of transistors.

* * * * *